United States Patent [19]

Japka et al.

[11] Patent Number: 4,623,400

[45] Date of Patent: Nov. 18, 1986

[54] HARD SURFACE COATINGS FOR METALS IN FLUIDIZED BEDS

[75] Inventors: Joseph E. Japka, Cherry Hill; Robert Staffin, Colonia; Swarnjeet S. Bhatia, Scotch Plains, all of N.J.

[73] Assignee: Procedyne Corp., New Brunswick, N.J.

[21] Appl. No.: 704,171

[22] Filed: Feb. 22, 1985

[51] Int. Cl.$^4$ .................... C23C 8/06; C23C 16/00
[52] U.S. Cl. ........................... 148/6.35; 148/6.3; 427/249; 427/255.2; 427/255.3
[58] Field of Search .................. 427/249, 255.2, 255.3; 148/6.3, 6.35

[56] References Cited

U.S. PATENT DOCUMENTS 4,262,039  4/1981  Gyarmati et al. ............. 427/249 X
4,486,473  12/1984  Kaae et al. ..................... 427/249

Primary Examiner—James R. Hoffman
Attorney, Agent, or Firm—Kane, Dalsimer, Kane, Sullivan and Kurucz

[57] ABSTRACT

A process and apparatus for surface coating of workpieces in fluidized beds under atmospheric or slightly higher pressure is disclosed. The process comprises submerging the workpiece(s) in the fluidized bed, mixing a metal halide with an inert gas to form the fluidizing gas, feeding to the fluidized bed another gas which is capable of reacting with the metal halide in the fluidized bed and coating the workpiece(s). The workpiece(s) are maintained at a temperature in the range of from 1600° F. to 2000° F. until it is evenly coated. The apparatus comprises a saturator vessel for saturating the inert gas with the metal halide and a fluid bed reactor. There are several advantages that the present invention offers over the prior art, namely, the coating can be performed in a relatively short period of time, 4 to 5 hours and that atmospheric pressure can be used, eliminating the need for a costly vacuum system.

26 Claims, 5 Drawing Figures

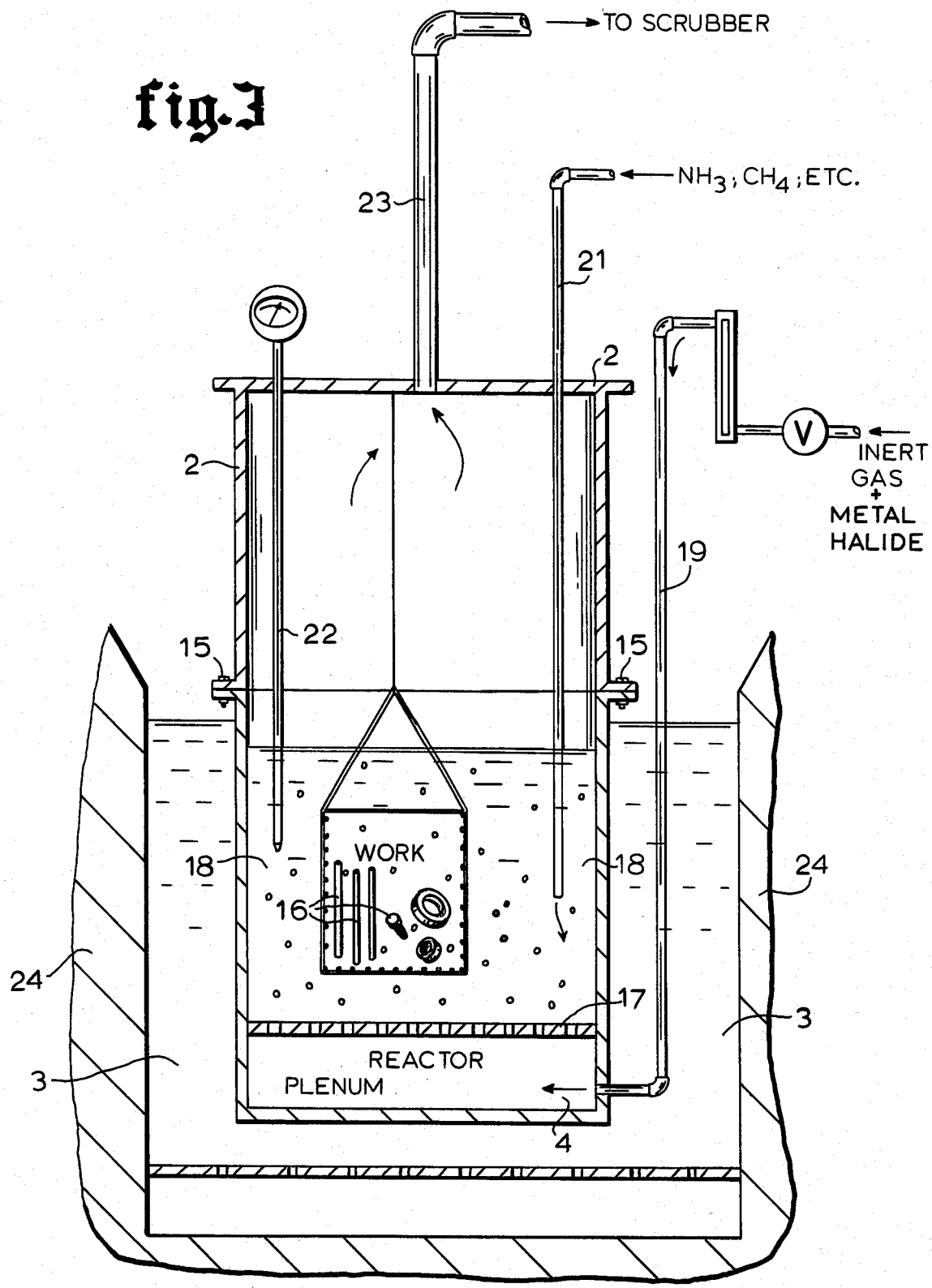

HARD SURFACE COATINGS FOR METALS IN FLUIDIZED BEDS

BACKGROUND OF THE INVENTION

1. Field of the Invention

The invention relates to a process and apparatus for surface coating of metals.

2. Description of the Prior Art

It is well known that surface depositions or coatings of various steel tools act as protective barriers against atmospheric effects, such as oxidation, as well as increasing their hardness and durability. The coatings applied to steel and carbide tools include titanium nitride, silicon nitride, titanium carbide, aluminum oxide and various combinations of the above. The addition of these coatings increase tool life from 2 to 5 times. The coatings applied are from 0.0002 to 0.002 in. thick depending upon the tooling requirements.

One of the commercial coating processes is called chemical vapor deposition (CVD) and it is used to treat both carbide and steel tools. Coatings are thin, hard, and have lubrication properties that improve the cutting action and reduce the coefficient of friction of tooling. Another commercial coating process is called plasma vapor deposition or ion implant coating (PVD).

In general, both of these processes involve applying the coating by loading the tools to be coated inside a vacuum chamber, evacuating the chamber with the parts up to some suitable temperature, in the case of CVD coatings from 1750° F. to 1950° F. and then introducing mixtures of suitable gases such as titanium chloride, ammonia and nitrogen. The chemical reaction at the high temperatures causes a deposit of titanium nitride or other hard coating to form on the surface of the tools over a period of two to four hours. Following the reaction, the vessel is cooled and the tools removed.

In the case of PVD coatings, a vacuum chamber with elaborate electrical controls for the sputtering is necessary, and though various parts can be coated with any combination of coatings, the coating is deposited only in a line of sight direction, and the parts must be rotated to achieve uniform coating.

In both of these commercially available processes, very costly vacuum systems are necessary, with attendant high maintenance costs typical of these systems. Also, treatment cycles are long due to the requirement to heat up, evacuate and cooldown the system. In addition, these systems are limited in the size that they can be constructed and remain technically feasible.

In the past few years, commercial atmosphere fluid bed heat treating has been brought to successful commercial use in heat treating. The use of fluid bed furnaces in various through and surface hardening treatments such as neutral hardening, nitriding, carburizing and nitrocarburizing has been found to offer significant advantage over alternative processes. In specific cases where case hardening is the treatment, it has been found that extreme uniformity can be obtained in a fluid bed furnace. In addition, there are operating cost advantages and conveniences to using a fluid bed furnace. In addition, fluid bed furnaces of very large volume have been built and deminstrated to be feasible to operate.

The apparatus and method used for surface coating in the present invention provides a number of the above mentioned advantages in terms of uniformity, low operating costs, and larger scale operation.

SUMMARY OF THE INVENTION

The present invention relates to a process and apparatus for hard surface coating of metals.

The invention comprises a process of coating a workpiece with a metal or metal hard compound in a fluidized bed reactor of inert particulate matter. A liquid halide of metal, e.g., $TiCl_4$ is heated to a temperature within the range of 70° F. to 160° F., and is evaporated into an inert gas, such as argon; this mixture is passed through the fluidized bed reactor, whose temperatures had been brought within the range of 1000° F. to 2200° F., thereby contacting the workpiece. Another reactive gas/gases selected for its/their ability to form a nitride, a carbide, a carbonitride or oxide with the metal halide is simultaneously passed through the fluidized bed. The workpiece is maintained in the bed at a temperature in the range of 1000° F. to 2200° F. at atmospheric or slightly higher pressure for a period of time sufficient to coat the workpiece. The reactive gas reacts with the metal halide and forms a metal or metal hard coating on the workpiece. The specific temperature of operation within the range of 1000° F. to 2200° F. is a significant factor in the thickness of coating and the time to achieve the coating.

The apparatus of the invention comprises a sealed and insulated stainless steel vessel for evaporating the halide of the metal to be deposited into the inert fluidizing gas and a fluid bed reactor which is connected to the vessel by means necessary for the delivery of the fluidizing gas containing the metal halide. The fluid bed reactor is also equipped to receive the gas to react with the metal halide. The reactor is equipped with an exit line to convey the gases to a scrubbing system.

An advantage of the present invention over the prior art is that coatings can be applied in equipment similar to that used in typical case hardening applications. Another advantage of the present invention of the disclosed process over those currently used commercially is that the coating can be performed in a cycle time of ½ to 5 hours, in contrast to 15 hours or more required when using prior art methods and apparatus.

A further major advantage is that the coating processes are performed under approximately atmospheric pressure, thus making the use of a vacuum system in the apparatus unnecessary.

The above advantages greatly reduce operational costs without compromising the efficiency of the coating process and the quality of the final product. Moreover, the coatings achieved with this process are of an even, lustrous appearance, thus aesthetically pleasing and potentially of higher quality.

BRIEF DESCRIPTION OF THE DRAWINGS

FIG. 3 shows a cross-section of the fluid bed reactor vessel.

DETAILED DESCRIPTION OF THE INVENTION

Figure 1:
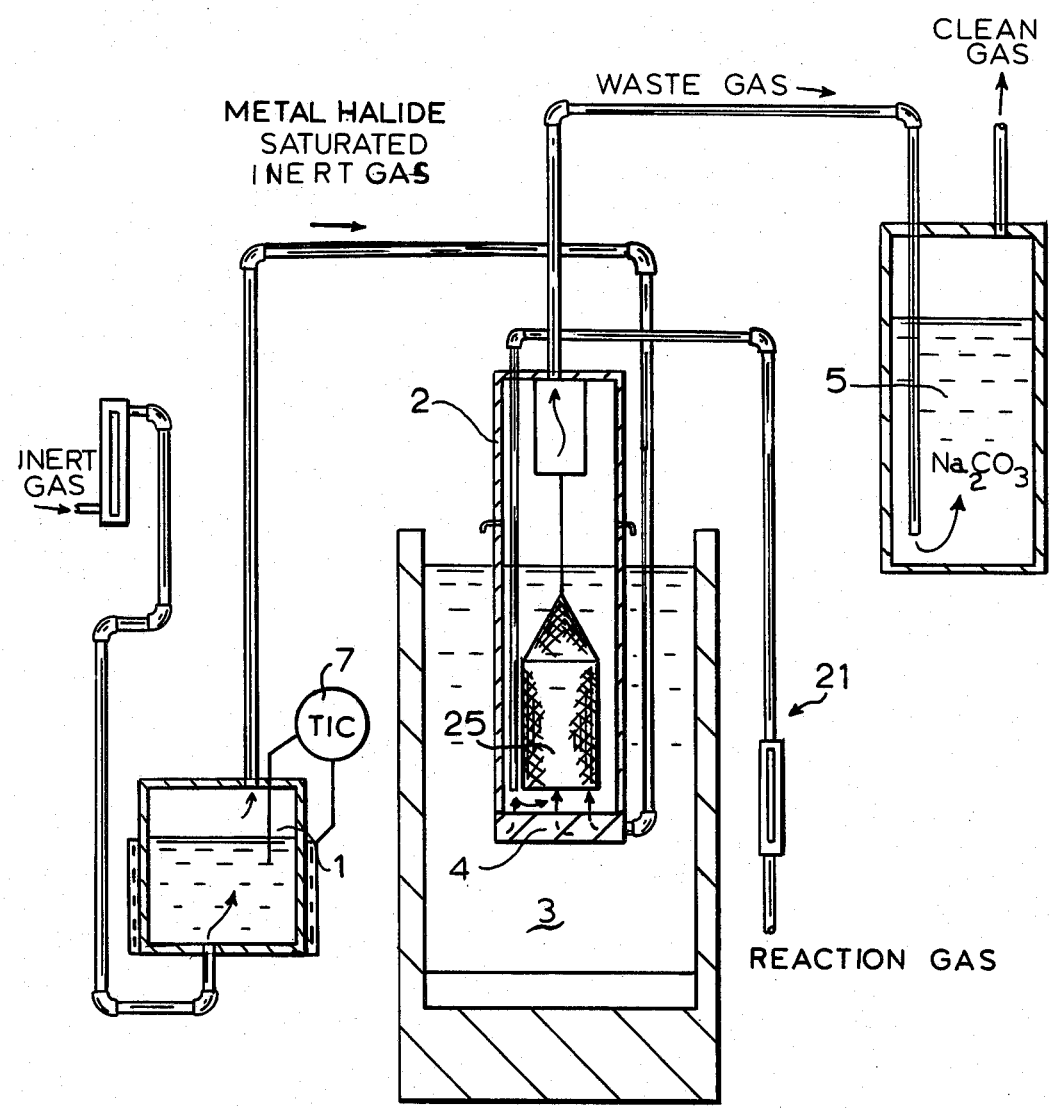
FIG. 1 is a schematic view of the basic components of the apparatus.

Referring initially to FIG. 1, the inert gas is introduced into the liquid metal halide (NOTE: the term halide includes chloride, bromide, fluoride, and iodide) supply vessel, 1, which is temperature controlled by a temperature control system, 7, to control the metal halide concentration in the inert gas.

The inert gas containing the metal halide is fed into the plenum, 4, of the fluid bed reactor, 2, as the fluidizing gas. The fluid bed reactor is maintained at a controlled temperature by a suitable heating means such as a heating mantel or the fluid bed furnace, 3. Fluidization of the reactor bed is achieved by the flow of the fluidizing gas containing the metal halide through the plenum, 4, of the fluid bed reactor. The reactor vessel, 2, is also equipped with additional tubing, 21, to allow the delivery of the other reactive gases, such as ammonia or methane. The reactor vessel, 2, is also equipped with a fixture or support basket, 25, to suspend the parts to be coated.

Waste gases are allowed to exit through a port at the top of the reactor vessel leading to a scrubber, 5, which uses a neutralizing agent such as sodium carbonate in a circulating aqueous solution.

The source of the coating is typically a liquid phase metal halide such as titanium tetrachloride. The metal halide is highly reactive and must be prevented from exposure to the atmosphere. Therefore, the liquid phase metal halide is handled in a sealed stainless steel insulated vessel which has a means for feeding an inert gas, such as argon or nitrogen, through the liquid phase metal halide, and a heating jacket such as an electrically heated jacket to control the temperature in the stainless steel vessel. The vessel is also equipped with the valves and tubing to deliver the inert gas now saturated with the metal halide to the fluid bed reactor.

Figure 2:
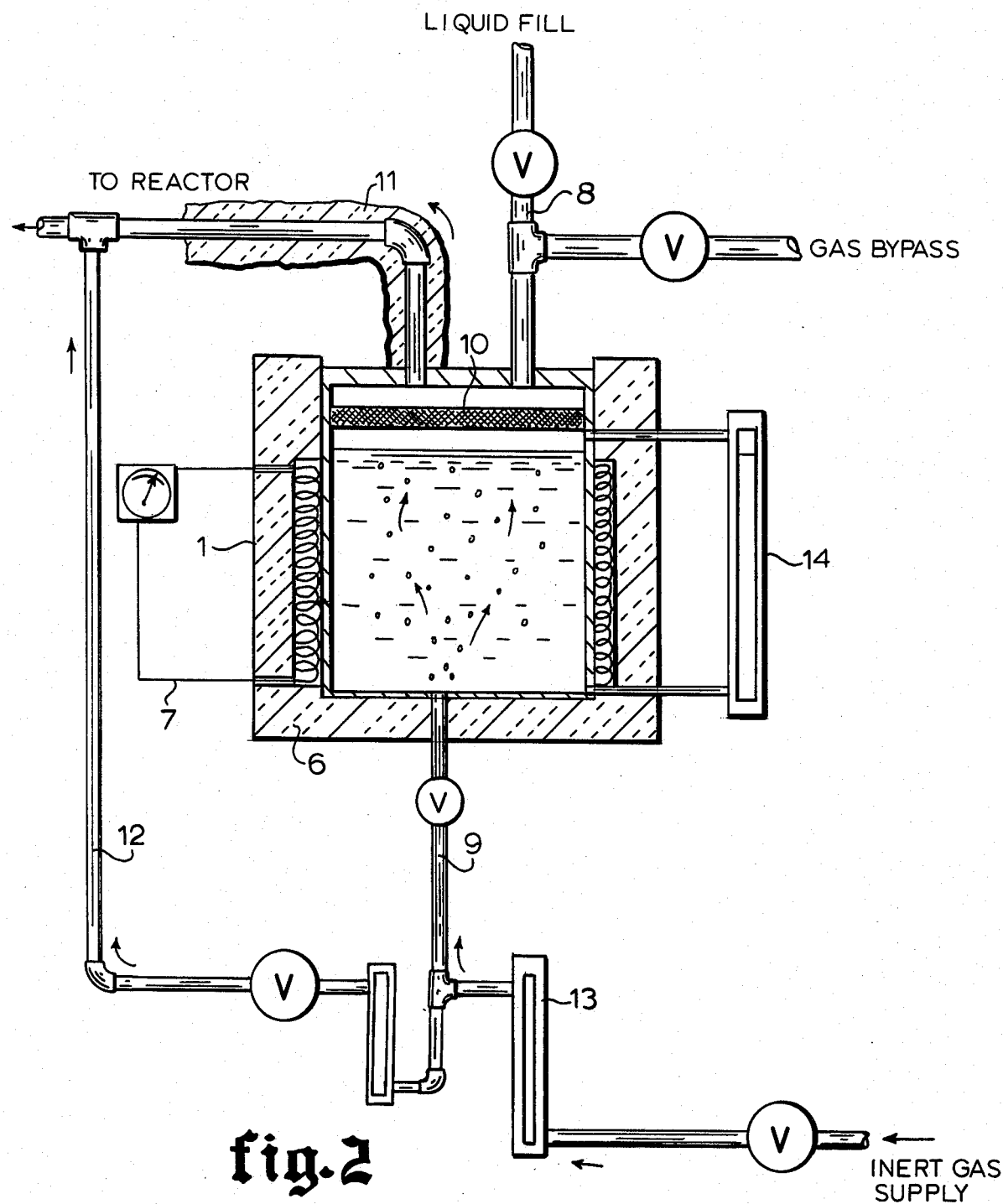
FIG. 2 shows a detailed cross-section of the liquid metal halide supply vessel.

Referring to FIG. 2, the saturator vessel, 1, is a sealed stainless steel insulated chamber. The chamber is enclosed by a jacket, 6, whose temperature is controlled by an electric heater, 7.

The following features are to be noted in a design of the liquid metal halide saturator vessel. The chamber is filled with the metal halide through an entry port, 8, at the top of the chamber. The inert gas is introduced into the vessel through inlet tubing, 9, located at the bottom of the vessel. A check valve, 26, keeps liquid phase from running into feed line, 9, when the inert gas flow rate is stopped. A demister screen, 10, is located near the top of the vessel, above the level of the liquid metal halide. The demister acts as a droplet barrier, preventing the entrainment of liquid metal halide droplets into the inert gas stream and then into the fluid bed reactor. The inert gas saturated with the metal halide passes through the demister screen, 10, and exits from the chamber through a heated and insulated tubing, 11, connected to the top of the chamber. This tubing leads to the fluid bed reactor vessel, 2 (See FIGS. 1 and 3).

The entry tubing, 9, and exit tubing, 11, are connected by a bypass tubing, 12. The bypass provides a mechanism for controlling the concentration of the metal halide below the saturation concentration level by controlling the flow of some of the inert gas through flowmeter, 13A, around the saturator vessel, 1 and mixing this bypassed inert gas with metal halide saturated inert gas in line 11.

Other features of the supply vessel include a flowmeter, 13, located between the inert gas supply and the inert tubing, 9; the chamber is also equipped with a level indicating chamber, 14, that facilitates observation of the level of liquid metal halide in the chamber.

Figure 2A:
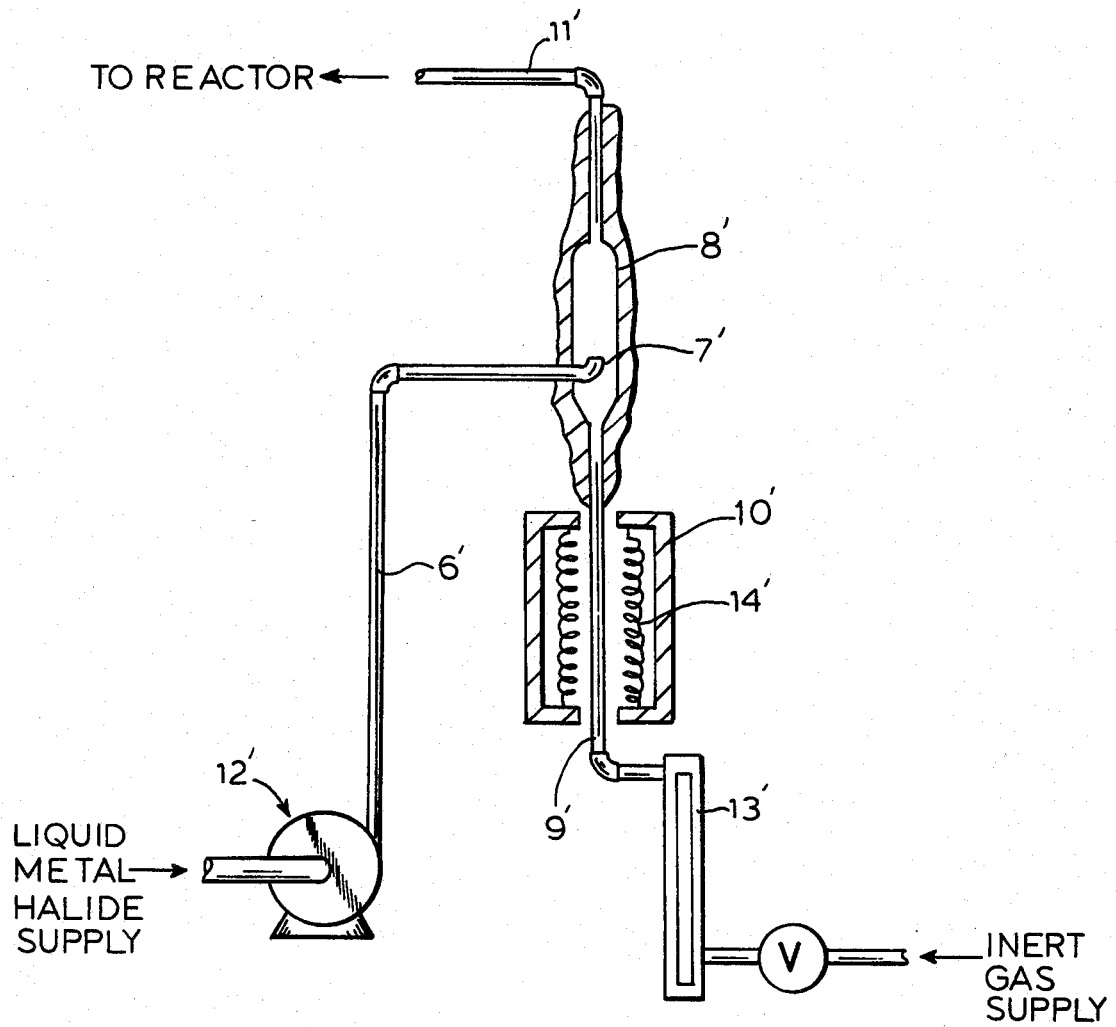
FIG. 2A shows a detailed cross-section of an alternate liquid metal halide supply vessel.

An alternate to controlling the feed of liquid metal halide to the fluid bed reactor vessel is shown in FIG. 2A. In this arrangement the inert gas is flow controlled by a valve and flow indicator, $13^1$, and is fed through tubing, $9^1$, and heated by heating element, $14^1$, in the insulating jacket, $10^1$, where its temperature is elevated and it is pumped into chamber $8^1$. The liquid metal halide is pumped by control metering pump, $12^1$, through tubing, $6^1$, and through spray nozzle $7^1$, into chamber, $8^1$, where it contacts the inert gas stream and is vaporized into the inert gas stream. The inert gas containing the controlled concentration of the metal halide is conveyed through tubing, $11^1$, to the reactor.

Shown in FIG. 3 is the fluid bed reactor, 2, which is a conventional design of a high allow cylindrical form manufactured and supplied by Procedyne Corp., New Brunswick, N.J. The reactor vessel consists of two parts that are disconnected through separation flanges, 15, allowing the loading of the workpiece, 16.

The reactor vessel consists of a main chamber separated from the plenum, 4, at the bottom of the reactor vessel by a metal diffusion plate, 17.

Fluidization of the bed, 18, is achieved with the metal halide containing inert gas that enters the plenum through tubing, 19.

Another gas entry tube is provided for the reactor vessel. This tube extends into the fluid bed. This feed tube, 21, delivers the other reaction gas, such as ammonia or methane. This tube can be located in various positions in the reactor or be fed into the plenum chamber of the chamber kept at a sufficiently low temperature to prevent premature reaction.

The internal temperature of the reactor vessel is monitored by a thermometer whose probe, 22, is immersed in the fluid bed. The top of the reactor vessel has an exit port, 23, leading to a scrubber. In the configuration shown in FIG. 3, the reactor vessel is heated by the fluid bed, 3, of a fluid bed furnace, 24, which serves as the heating source and the means of temperature control of fluid bed reactor, 2.

Figure 4:
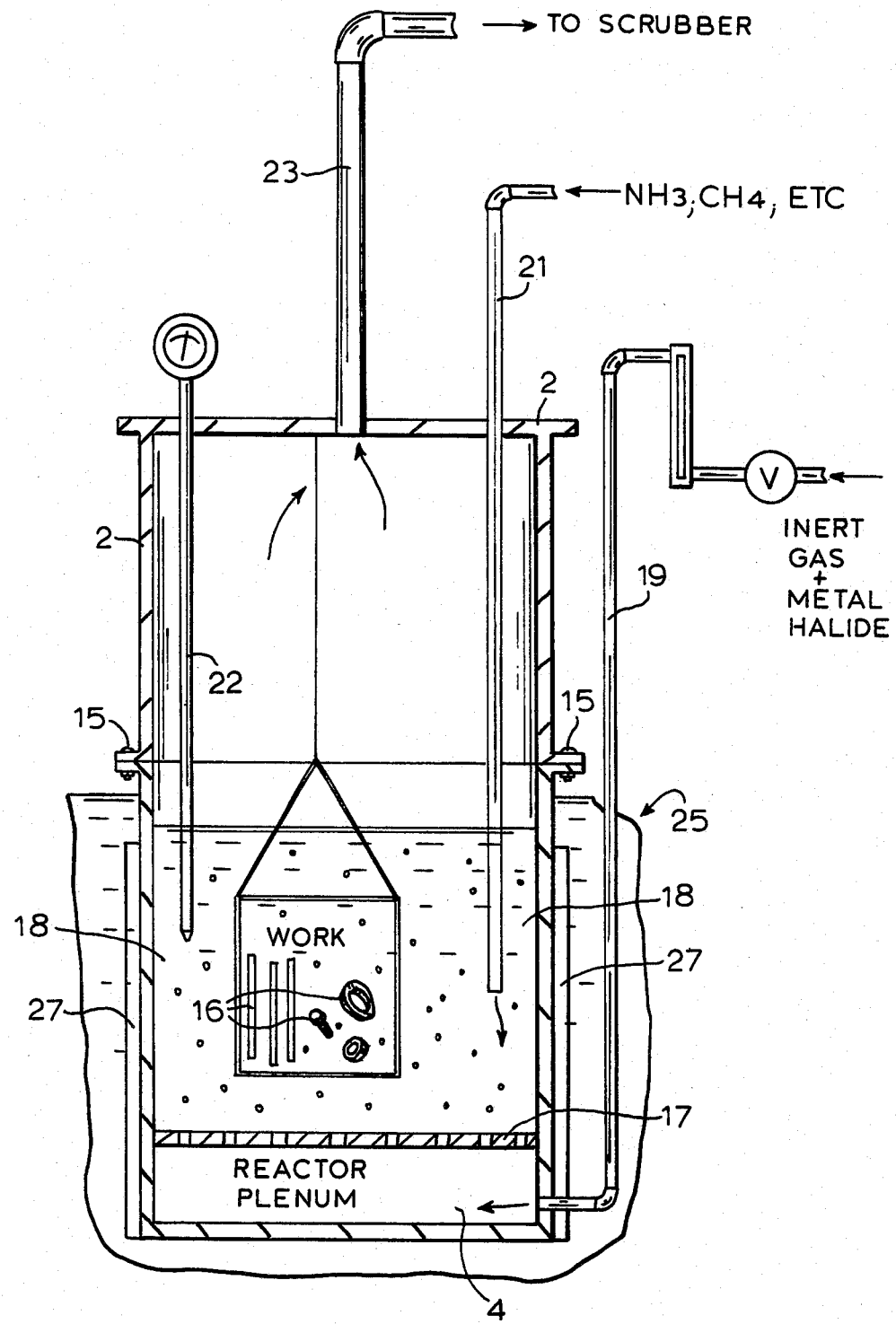
FIG. 4 shows a cross-section of the fluid bed reactor vessel with an alternate heating means.

An alternate heating configuration is shown in FIG. 4 where heating mantel, 25, is used as the heating source and the means of temperature control of fluid bed reactor, 2. Electric heaters, 27, provide the energy input of heating mantel, 25.

OPERATION OF THE INVENTION

The apparatus described in the previous section is designed principally for hard surface coating of metal tools.

A metal halide, such as titanium tetrachloride is evaporated into a stream of inert gas such as argon, to form a part of the fluidizing gas of a fluid bed reactor containing parts to be coated. This gas is pumped into the plenum chamber of the reactor and becomes the fluidizing gas of the reactor. Another gas, such as ammonia is also pumped into the lower portion of the fluid bed reactor causing a reaction with the titanium tetrachloride such as:

$$TiCl_4 + 3NH_3 \rightarrow TiN + 4HCl + 5/2H_2 + N_2$$

At elevated temperature the TiN coats the parts and forms a metallurgical bond with the surface of the part.

The fluid bed reactor is heated to coating temperature of 1000° F. to 2200° F. by placing it into a fluid bed furnace which rapidly transfers the heat into the reaction chamber. Consequently, after the coating cycle is completed, the fluid bed reactor is removed from the furnace and placed into a fluid bed quench bath for rapid cooling.

Modification of this apparatus can be envisioned where the fluid bed reactor is now permanently part of the furnace and cooling coils immersed within it can be used to rapidly bring the temperature down. It should be noted here that it is necessary to load the parts at temperature below 300° F. into the fluid bed reactor and remove them at a similar temperature to avoid surface oxidation. The nature of the coatings developed in this system preclude the possibility of removing them at high temperatures and exposing them to the atmosphere.

The major distinction between this process from other systems is that no vacuum furnace is necessary. The entire operation occurs under partial inert atmosphere together with the reaction products. The coating process occurs in a fluid bed comprising an inert particulate matter fluidized by an inert gas containing reactive gas components.

The fluid bed reactor covered by this application differs from a conventional fluid bed heat treating furnace in that the plenum is operated at the same temperature as the furnace and that some of the gases are fed through the plenum, some through auxiliary tubes leading directly into the fluid bed. An alternate arrangement is to cool the plenum and feed more or all of the gases into the plenum chamber. It is also important to note that the reactor is sealed at the top and the exit lines for the completed reaction gases are fed to a scrubber. The coating processes are performed under approximately atmospheric pressure and no costly vacuum systems are necessary in this apparatus.

Alternate approaches to heating and cooling the fluid bed reactor containing the parts include; the fluid bed reactor can be equipped with a heating jacket and cooling coils. The parts are then placed in the fluid bed reactor at lower temperature, the reactor cover is sealed, the heating jacket heats the reactor to coating temperature and controls the temperature during coating, and finally the cooling coils are used to cool down the reactor. The cover of the reactor is opened and the parts removed.

Another approach is to place the parts in the fluid bed reactor at lower temperature, the reactor cover is sealed. The heating system heats the reactor to coating temperature and controls the temperature during coating. A transfer hood is sealed over the fluid bed reactor and is purged with inert gas. The cover of the reactor is automatically opened and the parts are pulled into the transfer hood. The transfer hood plus parts is then fitted to a quench bath which is purged with inert gas. The parts are then transferred into the quench bath without exposure to air.

Control of the quality of the coating and its rate of application is performed by the concentration of metal halide gas and the concentration of reactant gas such as ammonia or methane in the fluid bed reactor, the temperature and the time of the coating process. It should be noted that the sand or particulate matter within the furnace also becomes coated at the same time as the parts, and may have to be renewed periodically.

The apparatus and process of this invention are envisioned as designed for the following coating applications:

A. Formation of titanium nitride.
B. Formation of any reactive metal carbides, such as titanium carbide, silicon carbide, zirconium carbide, tungsten carbide and other similar materials.
C. Formation of coatings such as aluminum oxide, zirconium oxide and other hard coating materials.
D. Formation of all the high temperature hard nitrides including zirconium nitride, niobium nitride, tantalum nitride, etc.
E. Sequential coatings are applied one over the other in layers, by varying the input gases.
F. Sulfate coatings for lubication purposes.

EXAMPLE 1

In the testwork, titanium tetrachloride was used as the precursor to the titanium nitride coating system. A mixture of ammonia and titanium tetrachloride carried in an inert argon atmosphere was fed to the fluid bed reactor. The feed rate of the $TiCl_4$ in the argon gas was 0.7 ft3/hr., and that of ammonia was 14 ft3/hr. Temperature of the fluid bed reactor before entry of gases was from 1850° F. to 1950° F. The reactor was heated with feed of reaction gases for three hours at 1850° C. The reaction was successful in that a 0.00038 in. coating was entirely deposited throughout the reaction vessel on high speed steel parts. The resultant titanium nitride coating is of a lustrous golden hue. The particulate aluminum oxide forming the inert fluid bed appeared to be uniformly coated.

While the process and apparatus of this invention have been described with particular reference to specific embodiments thereof, it is to be understood that the invention is not limited to this description.

What is claimed is:

1. A process of surface coating a metal workpiece in a short period of time under substantially atmospheric pressure comprising:
   a. fluidizing a bed of inert particulate matter;
   b. submerging the workpiece in the fluidizied bed;
   c. heating the submerged workpiece in the fluidized bed to a predetermined temperature;
   d. fluidizing the bed with an inert gas in which a metal halide has been mixed;
   e. feeding a gas capable of forming a nitride, a sulfide, a carbide or an oxide with the metal of the metal halide and depositing the nitride, sulfide, carbide or oxide on the surface of the workpiece;
   f. maintaining the bed at the elevated temperature and slightly greater than atmospheric pressure for a period sufficient to coat the workpiece and provide a metallurgical bond between the coating and the workpiece;
   g. cooling the coated workpiece.

2. The process of claim 1 wherein the workpiece is heated to a temperature within the range of from 1000° F. to 2200° F.

3. The process of claim 1 wherein the metal halide is heated in a saturator and saturates the inert fluidizing gas within the range of 70° F. to 200° F.

4. The process of claim 3 wherein the inert gas mixed with the liquid metal halide in a saturator is argon gas.

5. The process of claim 3 wherein the inert gas mixed with the liquid metal halide in a saturator is nitrogen gas.

6. The process of claim 3 wherein the inert gas mixed with the liquid metal halide in a saturator is helium gas.

7. The process of claim 1 wherein the heated halide is mixed with an inert gas by direct introduction and evaporation into the inert gas stream using a metering device.

8. The process of claim 7 wherein the inert gas mixed with the metal halide by direct introduction is argon.

9. The process of claim 7 wherein the inert gas mixed with the metal halide by direct introduction is nitrogen.

10. The process of claim 7 wherein the inert gas mixed with the metal halide by direct introduction is helium.

11. The process of claim 1 wherein the gas capable of forming a nitride, a sulfide, a carbide or an oxide with the metal of the metal halide is fed in a stoicheometric ratio with the metal halide of from 18/1 to 90/1.

12. The process of claim 1 wherein the fluid bed reactor is heated by placing it into a fluid bed furnace.

13. The process of claim 1 wherein the fluid bed reactor is removed from the furnace and placed into a fluid bed quench bath for rapid cooling after coating has been complete.

14. The process of claim 1 wherein the plenum of the fluid bed reactor is operated at the same temperature as the furnace or the plenum is cooled below the temperature of the furnace.

15. The process of claim 1 wherein the halide of the metal is titanium tetrachloride.

16. The process of claim 1 wherein the inert fluidizing gas is argon gas.

17. The process of claim 1 wherein the gas capable of forming a nitride is ammonia.

18. The process of claim 1 wherein the gas capable of forming a carbide is methane.

19. The process of claim 1 wherein the gas capable of forming an oxide is air or oxygen.

20. The process of claim 1 wherein the reaction gas delivered into the reactor to form a nitride with the metal halide is nitrogen gas.

21. The process of claim 1 wherein the surface coating is achieved in 4 to 5 hours.

22. The process of claims 4, 15 or 16 wherein the surface coating is completed in 3 hours at 1800° F.

23. The process of claim 22 wherein the surface coating is conducted under atmospheric or slightly higher pressure in the presence of argon.

24. A process of surface coating a metal workpiece in a short period of time under substantially atmospheric pressure comprising:
   a. fluidizing a bed of inert particulate matter;
   b. submerging the workpiece in the fluidized bed;
   c. heating the submerged workpiece in the fluidized bed to a predetermined temperature;
   d. fluidizing the bed with an inert gas in which a metal halide has been mixed;
   e. feeding a gas capable of forming a nitride, a carbide or an oxide with the metal of the metal halide and depositing the nitride, carbide or oxide on the surface of the workpiece to provide a metallurgical bond between the coating and the workpiece.

25. The process of claim 1 wherein the step of cooling the coated workpiece comprises cooling the fluidized bed and the workpiece and removing the coated workpiece.

26. The process of claim 1 wherein the step of cooling the coated workpiece comprises removing the coated workpieces from the hot fluidized bed a cooling chamber for rapid cool down.

* * * * *